United States Patent Office 3,592,649

Patented July 13, 1971

3,592,649

COLOR PHOTOGRAPHIC PROCESS FOR PRODUCING VISUALLY TRANSPARENT BUT PHOTOGRAPHICALLY OPAQUE PHOTOMASKS

Harry N. Parsonage and Melvyn I. Kruger, Dayton, Ohio, assignors to The Mead Corporation, Dayton, Ohio No Drawing. Filed Apr. 21, 1967, Ser. No. 632,568
Int. Cl. G03c *5/00, 7/00*
U.S. Cl. 96—36 22 Claims

ABSTRACT OF THE DISCLOSURE

Photomasks and a process for producing the same which comprises prehardening a high resolution photographic plate containing a latent photographic image in a prehardening bath, developing the plate in a developer containing a magenta and a yellow dye coupler and appropriate developing agents and then bleaching and stabilizing the resultant plate. A photomask is obtained containing a dye image in place of the normal opaque background. It is useful in photomechanical reproduction, particularly with positive photoresists in the production of semiconductive devices, and especially where multiple registering and printing operations are required.

BACKGROUND OF THE INVENTION

This invention relates to improvements in the technology of fabricating photomasks which are employed in producing microminiaturized electronic components. More particularly, the present invention relates to an improved method for producing photomasks having superior acuity and resolution, thereby permitting their use with positive photoresists, particularly in the manufacture of semiconductive devices. The use of photomasks produced by the present invention particularly facilitates the use of positive photoresists, although they may be used with negative photoresists.

Microminiaturized solid state devices are produced simultaneously in large number in order to improve the uniformity and reliability thereof and to reduce their cost of manufacture. In accomplishing a mass production technique, it has been the practice of the prior art, as for example in the production of solid state devices such as planar and mesa transistors, to produce large numbers of these devices in a single wafer of semiconductive material using a multistep photomechanical reproduction process with negative working photoresists. The prior art technique for fabricating devices in this manner has been to use a series of masks, each containing a repetitive array of a single element of the multiple element array required for the fabrication of the device, and then by a succession of alignment and fabricating steps, to construct the finished product. The stencil or mask which is employed may take the form of a suitable apertured thin metal foil or a processed glass plate coated with a photographic emulsion to produce an array of opaque images on a transparent background, or vice-versa, which images on any particular mask are representative of one of the elements to be reproduced in the semiconductive wafer. The mask is normally used as a negative to expose a thin film of photosensitive material previously deposited on the wafer of semiconductive material in which the semiconductor devices are to be constructed. Upon development, the unexposed resist material dissolves away, but the exposed resist remains in place to act as a selective mask against the action of certain chemicals.

Specifically, for example, the steps in manufacturing a planar, double-diffused, silicon transistor using a prior art technique is described herein. The first step is to grow thermally an oxide layer of a few microns thick on a suitable single crystal silicon wafer. Next, a photosensitive resist material is applied over the oxide, and the surface is selectively exposed through a photomask to define a great plurality of individual base diffusion areas. The wafer is chemically processed to remove the unexposed resist material from over the base areas. The barren sections of the oxide layer are then removed by an acid etch, such as hydrofluoric acid, the resist material defining the base area not being attacked. The resist overlay is next removed and base diffusion preformed using, for example, a boron compound. Diffusion is restricted to the barren silicon surface by the oxide overlay. The boron diffuses laterally under the oxide into the silicon as well as in a forward direction. Oxide is re-grown over the base region during the diffusion process. The emitter area is defined by a second photomaking and etching process similar to that just described, the emitter diffusion being carried out using a phosphorus compound, the oxide again masking all but the desired region. A third photomasking etching operation defines the base and collector contract regions after which aluminum or other suitable contact material is evaporated over the wafer to form the contact. Another and final photomasking step is used to remove the aluminum from the unwanted areas. By this technique, thousands of transistors may be formed on a single wafer of silicon. The wafer may then be scribe cut into individual transistor wafers preliminary to their installation in stems and to their use in other applications.

However, the chemical and physical characteristics of negative working photoresists point up the limitations which emphasize the need to employ positive working photoresists. Positive resists have a sensitivity which is comparable to that of negative resists, but with greatly improved resolution and acuity. Positive photoresists, however, have not been employed to any great extent in actual practice because of the difficulty of registering highly opaque photomasks.

The widest use of positive photoresists in the prior art has been in the production of semiconductors on selenium wafers. The semiconductors or micro-electronic circuits are prepared by contact printing photomasks onto a selenium wafer previously coated with positive photoresist. After processing and etching, the wafer is again coated wtih photoresist, as outlined above, and another photomask image is overlaid and registered on the first. This then involves multiple printing steps which require accurate registration of the subsequent photomasks over previously etched artwork. The use of positive working photoresists requires photomasks having predominantly fine clear lines on a dark background. Registering such a photomask is very difficult, and this is the limiting factor for any widespread use thereof in industry.

The present invention provides a solution to the aforementioned problem which makes it possible to use positive working photoresists without difficulty.

Accordingly, one of the objects of the present invention is to provide a process for producing photomasks which may be used in manufacturing microminiaturized components, which overcomes the disadvantages and deficiencies of the prior art methods.

Another object of the present invention is to provide photomasks useful for producing, for example, semiconductive devices with, if desired, positive photoresists, but without the disadvantages encountered therewith in the prior art.

Still another object of the invention is to provide novel photomasks and a process for producing the same.

Yet another object of the present invention is to provide a color coupler developer solution which yields visually transparent but photographically opaque photomasks which facilitate multiple registrations with either positive or negative working photoresists.

These and other objects and advantages of the present invention will become apparent to those skilled in the art from a consideration of the following specification and claims.

SUMMARY OF THE INVENTION

In accordance with the present invention, it has been found that the replacement of the opaque background of conventional photomasks with a dye image affords the achievement of the objects mentioned hereinabove. The chemical process steps of the present invention enable the development of an orange colored dye image in the high resolution plate containing the photographic image which is to be photomechanically reproduced. The dye absorbs radiation in the spectrum to which the photoresists are most sensitive, about 3,000 nanometers, yet it transmits radiation in that part of the spectrum which is characteristic of dark-room safelights. This facilitates the registration required in multiple printing operations.

Thus, in accordance with the process of the present invention, the photomask is printed on high resolution plates, for example, Eastman Kodak High Resolution Photographic Plates, and is developed to produce photographically opaque, yet visually transparent images. Photomasks produced by the chemical development process of the present invention may be easily registered, under safelight conditions, as is required in multiple printing steps. Once the mask is registered, printing of the photomask image onto the resist with ultraviolet radiation is accomplished with ease. Because of the ease of registration afforded by the present invention, positive working photoresists may be used in such processes, resulting in the production of higher quality microelectronic components.

The use of transparent photomasks per se has been known in the prior art. For example, a method of preparing transparent photomasks from original silver images has been reported in the literature. A post-development process is employed wherein the silver image is replaced with a mordant of mercurous-silver bromide. The mordanted image is then reduced in sulfite to a sepia color. The disadvantage of this method is the low saturation and low purity of the hue produced.

On the other hand, the chemical development process of the present invention is capable of producing transparent photomasks on high resolution photographic plates. The dye image produced is superior in hue and saturation to masks produced by other methods. Moreover, the edge acuity is enhanced and improved with the use of the present method for producing photomasks. The chemical formulation of the developer makes it possible to obtain a more readily reproducible and controllable processing than with the conventional black-and-white developers. As noted above, the use of photomasks produced by the present process makes much easier the registration required in multiple printing operations, with the result that printing heretofore unattainable may be performed.

Four chemical solutions are employed in the process of the present invention. These are used sequentially to develop a high resolution photographic plate to give a visually transparent photomask. The processing sequence is as follows:

(1) Prehardening—30 seconds
(2) Water wash—30 seconds
(3) Development—10 minutes
(4) Water wash—60 seconds
(5) Bleaching—2 minutes
(6) Water wash—60 seconds
(7) Stabilization—3 minutes
(8) Water wash—5 minutes
(9) Air dry The durations of time shown are preferred, but may be varied somewhat. The solutions are kept at a temperature of about 80° F.±1° F. Steps 1–5 are carried out under appropriate safelight conditions. The remaining steps may then be carried out under normal room light.

The prehardening step is carried out in a bath containing water and an alkali metal (typically sodium or potassium) metaborate, an alkali metal sulfate, an alkali metal bisulfite and a hardener. Suitable hardeners include, for example, potassium or sodium alum, potassium or sodium dichromate, glyoxal, formaldehyde, polyhydroxyphenyl carbinols and mixtures thereof.

Development is achieved in a color coupler developer comprising the following essential ingredients:

(a) About 3 parts by weight of a magenta dye coupler having the general formula

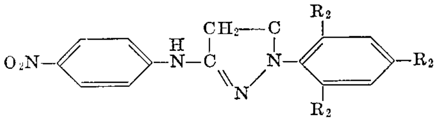

wherein the same or a different member selected from the group consisting of $R_2$ is a halogen or hydrogen.

(b) About 5 parts by weight of a yellow dye coupler having the general formula

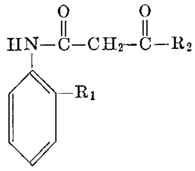

wherein $R_1$ is a lower alkoxy group, a methyl group or hydroxyl, $R_2$ is an aryl or lower alkaryl group.

(c) About 3 parts by weight of a color developing agent having the general formula

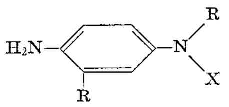

wherein R is the same or different lower alkyl group and X is an alkyl sulfonamido, an alkylhydroxy or an alkylamino group.

(d) About 2.3 parts by weight of a developing agent having the general formula

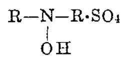

wherein R is a lower alkyl group.

By "lower alkyl" or "lower alkoxy," it is meant to refer to alkyl groups containing from 1 to 4 carbon atoms, i.e., methyl, ethyl, n-propyl, isopropyl, n-butyl, sec.-butyl, etc. "Halogen" normally refers to chloride or bromide.

The magenta and yellow dye couplers form their respective subtractive primary dyes which join to produce a monochromatic orange hue which demonstrates strong absorption near the ultraviolet and blue light regions of the spectrum, while readily transmitting in the red area of the visible spectrum. This results in visually transparent photomasks having clear areas and an orange background.

The developing step serves to develop the dye and the silver proportionally in the photographic plate. The silver is converted to a soluble salt, for example, silver bromide, in the bleaching step. The stabilization bath and subsequent water wash dissolve and remove the soluble silver salt.

The bleaching step is carried out in an aqueous solution of an alkali metal bromide, an alkali metal ferricyanide, an alkali metal persulfate and an alkali metal metaborate. The stabilization bath comprises a basic (pH of about 8) aqueous solution of an alkali metal sulfite and an alkali metal thiosulfate.

DESCRIPTION OF THE PREFERRED EMBODIMENTS

Specific examples of formulations within the above-described categories are shown in the following and constitute preferred embodiments of the present invention. These formulations are given merely as illustrative of the present invention and are not to be considered as limiting thereof.

Prehardening may be carried out in a solution having the following exemplary formulation:

Water (125° F.)—600 ml.
Sulfuric acid (36 N)—3.12 grams
Sodium metaborate·$5H_2O$—15.0 grams
Sodium sulfate—200.0 grams
Sodium bisulfite—1.0 gram
Hardener—3–4% by weight
Water to make 1,000 ml.

The development step in accordance with the present invention is carried out using a color coupler developer having the following exemplary formulation (the amounts shown being variable by about ±10% by weight):

Water (125° F.)—650 ml.
Sodium sulfite—60 grams
Sodium bromide—2.2 grams
Color developing agent—3.1 grams
Organic amine—4.5 grams
Polyethylene glycol—0.5 gram
Magenta dye coupler—3.0 grams
Hexylene glycol—50 ml.
Sodium hydroxide—3.5 grams
Yellow dye coupler—5.0 grams
Developing agent—2.3 grams
6-nitrobenzimidazole nitrate—12 mg.
Water to make 1,000 ml.

The color developing agent has the general formula shown hereinabove. Exemplary of such compounds are 4-amino-N-ethyl-N-(β-methane sulfonamidoethyl)-m-toluidine sesquisulfate monohydrate and 4-amino-3-methyl-N-ethyl-N-(β-hydroxyethyl) aniline sulfate.

The magenta dye coupler has the general formula shown hereinabove. Such compounds include, for example, 1-(2,4,6-trichlorophenyl)-3-p-nitroanilino-2-pyrazoline-5-one and 1-phenyl-3-p-nitroanilino-2-pyrazoline-5-one.

The yellow dye coupler likewise has the general formula shown hereinabove therefor. Suitable compounds include, for example, α-benzoyl-o-methoxy acetanilide and α-benzoyl-o-ethoxy acetanilide.

As shown above, the developing agent has the general formula $$R{-}\underset{\substack{|\\ OH}}{N}{-}R\cdot SO_4$$

wherein R may be the same or different short-chain aliphatic groups (lower alkyl). For example, compounds such as diethylhydroxylamine sulfate and methyl-N-ethyl-N-hydroxylamine sulfate may be employed.

The organic amine may be either a primary or a secondary aliphatic amine containing between 2 and 4 carbon atoms per molecule. The polyethylene glycol may have a molecular weight between 500 and 5,000.

The bleaching operation is carried out using a solution having the following exemplary formulation:

Water (125° F.)—800 ml.
Sodium bromide—13.2 grams
Potassium ferricyanide—31.6 grams
Potassium persulfate—23.4 grams
Potassium metaborate·$5H_2O$—1.31 grams
Water to make 1,000 ml.

The stabilization bath may have the following exemplary formulation:

Water (100° F.)—800 ml.
Sodium sulfite—10 grams
Sodium thiosulfate·$5H_2O$—240 grams
Sodium hydroxide—2 grams
Water to make 1,000 ml.

While preferred embodiments, illustrative of the method of the present invention, have been described hereinabove, it will be obvious to those skilled in the art that the invention may be varied in many ways. Such variations are not to be regarded as a departure from the spirit and scope of the invention, and all such modifications are intended to be included within the scope of the following claims.

We claim:

1. A process for the production of photomasks suitable for use in photomechanical reproduction which comprises prehardening a high resolution silver halide photographic plate containing a latent photographic image in a suitable prehardening bath, developing the plate in a color coupler developer comprising about 3 parts by weight of a magenta dye coupler having the general formula

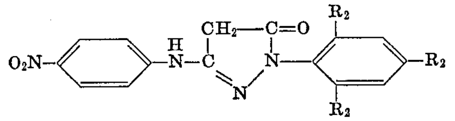

wherein $R_2$ is a halogen or hydrogen, about 5 parts by weight of a yellow dye coupler having the general formula

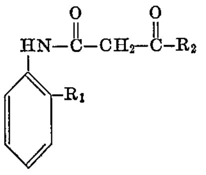

wherein $R_1$ is a lower alkoxy group, a methyl group or hydroxyl, $R_2$ is an aryl or lower alkaryl group, about 3 parts by weight of a color developing agent having the general formula

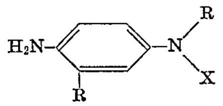

wherein R is the same or different lower alkyl group and X is an alkyl sulfonamido, alkylhydroxy or an alkylamino group, and about 2.3 parts by weight of a developing agent having the general formula $$R{-}\underset{\substack{|\\ OH}}{N}{-}R\cdot SO_4$$

wherein R is a lower alkyl group, whereby an orange colored dye image is formed in said plate, bleaching the resultant plate so as to convert the silver in the plate to a soluble salt and then stabilizing the plate in a suitable stabilization bath, whereby the soluble silver salt is removed from the plate to leave a dye image with superior hue and saturation.

2. The process of claim 1, wherein said prehardening bath comprises an aqueous solution of an alkali metal salt of a metaborate, a sulfate and a bisulfite and about 3 to 4% by weight of a hardener.

3. The process of claim 2, wherein said hardener is selected from the group consisting of potassium or sodium alum, potassium or sodium dichromate, glyoxal, formaldehyde, polyhydroxyphenyl carbinols and mixtures thereof.

4. The process of claim 1, wherein said bleaching step is carried out in an aqueous solution comprising an alkali metal salt of a bromide, a ferricyanide, a persulfate and a metaborate.

5. The process of claim 1, wherein said stabilization bath comprises a basic aqueous solution of an alkali metal sulfite and an alkali metal thiosulfate.

6. A process for the production of photomasks suitable for use in photomechanical reproduction which comprises prehardening a high resolution silver halide photographic plate containing a latent photographic image in a prehardening bath comprising an aqueous solution of an alkali metal salt of a metaborate, a sulfate and a bisulfite and about 3 to 4% by weight of a hardener, developing the plate in a color coupler developer comprising about 3 parts by weight of a magenta dye coupler having the general formula

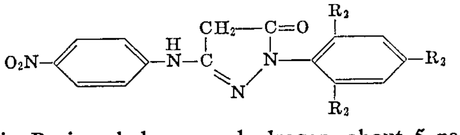

wherein $R_2$ is a halogen or hydrogen, about 5 parts by weight of a yellow dye coupler having the general formula

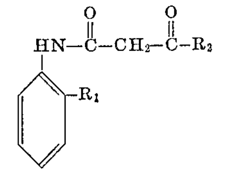

wherein $R_1$ is a lower alkoxy group, a methyl group or hydroxyl, $R_2$ is an aryl or lower alkaryl group, about 3 parts by weight of a color developing agent having the general formula

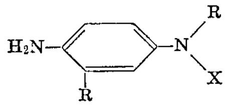

wherein R is the same or different lower alkyl group and X is an alkyl sulfonamido, alkylhydroxy or an alkylamino group, and about 2.3 parts by weight of a developing agent having the general formula

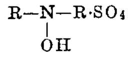

wherein R is a lower alkyl group, whereby an orange colored dye image is formed in said plate, bleaching the resultant plate in an aqueous solution comprising an alkali metal salt of a bromide, a ferricyanide, a persulfate and a metaborate so as to convert the silver in the plate to a soluble salt, and then stabilizing the plate in a stabilization bath comprising a basic aqueous solution of an alkali metal sulfite and an alkali metal thiosulfate, whereby the soluble silver salt is removed from the plate to leave a dye image with superior hue and saturation.

7. The process of claim 6, wherein said hardener is selected from the group consisting of potassium or sodium alum, potassium or sodium dichromate, glyoxal, formaldehyde, polyhydroxyphenyl carbinols and mixtures thereof.

8. A process for photomechanically reproducing a desired image which comprises applying a layer of a photoresist material to the surface of a substrate, registering the image contained in a photomask produced by a process comprising the steps of prehardening a high resolution silver halide photographic plate containing a latent photographic image in a suitable prehardening bath, developing the plate in a color coupler developer comprising about 3 parts by weight of a magenta dye coupler having the general formula

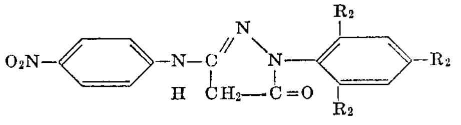

wherein $R_2$ is a halogen or hydrogen, about 5 parts by weight of a yellow dye coupler having the general formula

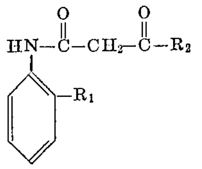

wherein $R_1$ is a lower alkoxy group, a methyl group or hydroxyl, $R_2$ is an aryl or lower alkaryl group, about 3 parts by weight of a color developing agent having the general formula

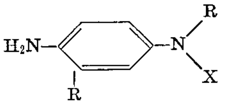

wherein R is the same or a different lower alkyl group and X is an alkyl sulfonamido, alkylhydroxy or an alkylamino group, and about 2.3 parts by weight of a developing agent having the general formula

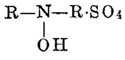

wherein R is a lower alkyl group, whereby an orange colored dye image is formed in said plate, bleaching the resultant plate so as to convert the silver in the plate to a soluble salt and then stabilizing the plate in a suitable stabilization bath, whereby the soluble silver salt is removed from the plate to leave a dye image with superior hue and saturation, on the photoresist covered surface, selectively exposing the photoresist through the photomask, and removing a portion of the photoresist.

9. The process of claim 8, wherein said photoresist material is coated upon previously etched artwork on said substrate.

10. The process of claim 8, wherein said process of photochemical reproduction is repeated with photomasks having different designs.

11. The process of claim 10, wherein said photoresist material is a positive photoresist.

12. A color coupler developer solution, capable of producing a monochromatic hue other than one of the three subtractive primaries cyan, magenta and yellow, comprising about 3 parts by weight of a magenta dye coupler having the general formula

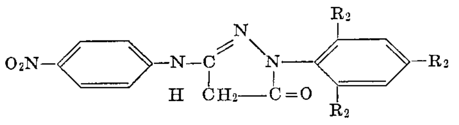

wherein $R_2$ is a halogen or hydrogen, about 5 parts by weight of a yellow dye coupler having the general formula

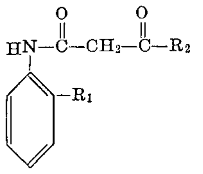

wherein $R_1$ is a lower alkoxy group, a methyl group or hydroxyl, $R_2$ is an aryl or lower alkaryl group, about 3 parts by weight of a color developing agent having the general formula

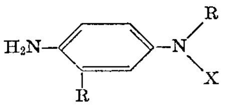

wherein R is the same or a different lower alkyl group and X is an alkyl sulfonamido, alkylhydroxy or an alkylamino group, and about 2.3 parts by weight of a developing agent having the general formula $$R{-}\underset{\displaystyle OH}{\underset{|}{N}}{-}R\cdot SO_4$$

wherein R is a lower alkyl-group.

13. The color coupler developer solution of claim 12, further including an alkali metal sulfite, an alkali metal bromide, an aliphatic amine, polyethylene glycol, hexylene glycol and 6-nitrobenzimidazole nitrate.

14. A color coupler developer solution, capable of producing a monochromatic hue other than one of the three substractive primaries cyan, magenta and yellow, having the following approximate composition:

Sodium sulfite—60 grams
Sodium bromide—2.2 grams
Color developing agent—3.1 grams
Organic amine—4.5 grams
Polyethylene glycol—0.5 gram
Magenta dye coupler—3.0 grams
Hexylene glycol—50 ml.
Sodium hydroxide—3.5 grams
Yellow dye coupler—5.0 grams
Developing agent—2.3 grams
6-nitrobenzimidazole nitrate—12 mg.
Water to 1,000 ml.

said color developing agent having the general formula

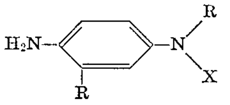

wherein R is the same or different lower alkyl group and X is an alkyl sulfonamide, alkylhydroxy or an alkylamino group, said organic amine being a primary or secondary aliphatic amine having from 2 to 4 carbon atoms, said polyethylene glycol having a molecular weight between about 500 and 5000, said magenta dye coupler having the general formula

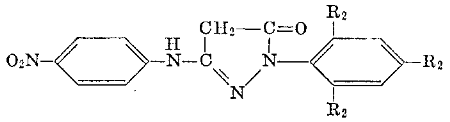

and $R_2$ is a halogen or hydrogen, said yellow dye coupler having the general formula

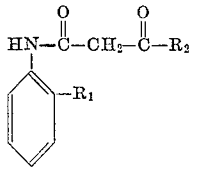

wherein $R_1$ is a lower alkoxy group, a methyl group or hydroxyl and $R_2$ is an aryl or lower alkaryl group, and said developing agent having the general formula $$R{-}\underset{\displaystyle OH}{\underset{|}{N}}{-}R\cdot SO_4$$

wherein R is a lower alkyl group, the amounts shown being variable to about $\pm$% by weight.

15. The color coupler developer solution of claim 14, wherein said color developing agent is 4-amino-N-ethyl-N-($\beta$-methane sulfonamidoethyl)-m-toluidine sesquisulfate monohydrate or 4-amino-3-methyl-N-ethyl-N-($\beta$-hydroxyethyl)aniline sulfate.

16. The color coupler developer solution of claim 14, wherein said magenta dye coupler is 1-(2,4,6-trichlorophenyl)-3-p-nitroanilino-2-pyrazoline - 5 - one or 1-phenyl-3-p-nitroanilino-2-pyrazoline-5-one.

17. The color coupler developer solution of claim 14, wherein said yellow dye coupler is $\alpha$-benzoyl-o-methoxy acetanilide or $\alpha$-benzoyl-o-ethoxy acetanilide.

18. The color coupler developer solution of claim 14, wherein said developing agent is diethylhydroxylamine sulfate or methyl-N-ethyl-N-hydroxylamine sulfate.

19. The process of claim 1, wherein: the magenta dye coupler is selected from the group consisting of 1-(2,4,6-trichlorophenyl) - 3 - p -nitroanilino - 2 - pyrazoline - 5-one and 1 - phenyl - 3 - p - nitroanilino - 2 - pyrazoline-5-one; the yellow dye coupler is selected from the group consisting of $\alpha$-benzoyl-o-methoxy acetanilide and $\alpha$-benzoyl-o-ethoxy acetanilide; the color developing agent is selected from the group consisting of 4-amino-N-ethyl-N-($\beta$-methane sulfonamidoethyl)-m-toluidine sesquisulfate monohydrate and 4-amino-3-methyl-N-ethyl-N-($\beta$-hydroxyethyl) aniline sulfate; and the developing agent is selected from the group consisting of diethylhydroxylamine sulfate and methyl-N-ethyl-N-hydroxylamine sulfate.

20. The process of claim 6, wherein: the magenta dye coupler is selected from the group consisting of 1-(2,4,6-trichlorophenyl)-3-p-nitroanilino - 2 - pyrazoline - 5 - one and 1-phenyl-3-p-nitroanilino-2-pyrazoline-5-one; the yellow dye coupler is selected from the group consisting of $\alpha$-benzoyl-o-methoxy acetanilide and $\alpha$-benzoyl-o-ethoxy acetanilide; the color developing agent is selected from the group consisting of 4-amino-N-ethyl-N-($\beta$ - methane sulfonamidoethyl-m-toluidine sesquisulfate monohydrate and 4 - amino - 3 - methyl - N - ethyl - N - ($\beta$ -hydroxyethyl)aniline sulfate; and the developing agent is selected from the group consisting of diethylhydroxylamine sulfate and methyl-N-ethyl-N-hydroxylamine sulfate.

21. The process of claim 8, wherein: the magenta dye coupler is selected from the group consisting of 1-(2,4,6-trichlorophenyl)-3-p-nitroanilino - 2 - pyrazoline - 5 - one and 1-phenyl-3-p-nitroanilino-2-pyrazoline-5-one; the yellow dye coupler is selected from the group consisting of $\alpha$-benzoyl-o-methoxy acetanilide and $\alpha$-benzoyl-o-ethoxy acetanilide; the color developing agent is selected from the group consisting of 4-amino-N-ethyl-N-($\beta$-methane sulfonamidoethyl) - m - toluidine sesquisulfate monohydrate and 4-amino-3-methyl-N-ethyl-N-($\beta$-hydroxyethyl) aniline sulfate; and the developing agent is selected from the group consisting of diethylhydroxylamine sulfate and methyl-N-ethyl-N-hydroxylamine sulfate.

22. The process of claim 12, wherein: the magenta dye coupler is selected from the group consisting of 1-(2,4,6-trichlorophenyl)-3-p-nitroanilino - 2 - pyrazoline - 5 - one and 1-phenyl - 3 - p - nitroanilino - 2 - pyrazoline - 5 - one; the yellow dye coupler is selected from the group consisting of $\alpha$-benzoyl-o-methoxy acetanilide and $\alpha$-benzoyl-o-ethoxy acetanilide; the color developing agent is selected from the group consisting of 4-amino-N-ethyl-N-($\beta$-methane sulfonamidoethyl) - m - toluidine sesquisulfate monohydrate and 4-amino-3-methyl-N-ethyl - N - ($\beta$-hydroxyethyl) aniline sulfate; and the developing agent is selected from the group consisting of diethylhydroxylamine sulfate and methyl-N-ethyl-N-hydroxylamine sulfate.

References Cited

UNITED STATES PATENTS

| | | | |
|---|---|---|---|
| 3,127,269 | 3/1964 | Greenhalgh et al. | 96—100 |
| 3,202,509 | 8/1965 | Drake et al. | 96—36.2 |
| 3,288,607 | 11/1966 | Middleton | 96—36.2 |
| 2,191,037 | 2/1940 | Mannes et al. | 96—55 |
| 3,157,499 | 11/1964 | Trusheim | 96—67 |
| 3,168,400 | 2/1965 | Blackmer et al. | 96—22 |
| 3,245,794 | 4/1966 | Conley | 96—36.2 |
| 3,335,004 | 8/1967 | Wrisley et al. | 96—22 |

J. TRAVIS BROWN, Primary Examiner

U.S. Cl. X.R.

96—36.2, 56.5, 60, 61